United States Patent
Zhang et al.

(10) Patent No.: US 7,728,402 B2
(45) Date of Patent: Jun. 1, 2010

(54) SEMICONDUCTOR DEVICES INCLUDING SCHOTTKY DIODES WITH CONTROLLED BREAKDOWN

(75) Inventors: Qingchun Zhang, Cary, NC (US); Sei-Hyung Ryu, Raleigh, NC (US); Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 241 days.

(21) Appl. No.: 11/496,842

(22) Filed: Aug. 1, 2006

(65) Prior Publication Data

US 2008/0029838 A1    Feb. 7, 2008

(51) Int. Cl.
- H01L 27/095    (2006.01)
- H01L 29/47    (2006.01)
- H01L 29/812    (2006.01)
- H01L 31/07    (2006.01)

(52) U.S. Cl. .................. 257/471; 257/484; 257/E27.04; 257/E29.338

(58) Field of Classification Search ................. 257/471, 257/472, E29.338, E31.065, E31.066, 104, 257/106, 112, 155, 260, 474, 484, 928, E27.04, 257/267

See application file for complete search history.

(56) References Cited

U.S. PATENT DOCUMENTS

| | | | | |
|---|---|---|---|---|
| 5,545,905 | A * | 8/1996 | Muraoka et al. | ............ 257/268 |
| 6,104,043 | A | 8/2000 | Hermansson et al. | |
| 6,399,996 | B1 * | 6/2002 | Chang et al. | ................. 257/484 |
| 6,524,900 | B2 | 2/2003 | Dahlqvist et al. | |
| 6,861,723 | B2 | 3/2005 | Willmeroth | |
| 6,936,850 | B2 | 8/2005 | Friedrichs et al. | |
| 7,026,650 | B2 | 4/2006 | Ryu et al. | |
| 2002/0121641 | A1 * | 9/2002 | Alok et al. | ..................... 257/76 |
| 2002/0125482 | A1 | 9/2002 | Friedrichs et al. | |

(Continued)

FOREIGN PATENT DOCUMENTS

JP    2000-252478 A    9/2000

(Continued)

OTHER PUBLICATIONS

Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).

(Continued)

*Primary Examiner*—Hoai V Pham
(74) *Attorney, Agent, or Firm*—Myers Bigel Sibley & Sajovec

(57) ABSTRACT

A semiconductor device includes a semiconductor layer having a first conductivity type, a metal contact on the semiconductor layer and forming a Schottky junction with the semiconductor layer, and a semiconductor region in the semiconductor layer. The semiconductor region and the semiconductor layer form a first p-n junction in parallel with the Schottky junction. The first p-n junction is configured to generate a depletion region in the semiconductor layer adjacent the Schottky junction when the Schottky junction is reversed biased to thereby limit reverse leakage current through the Schottky junction. The first p-n junction is further configured such that punch-through of the first p-n junction occurs at a lower voltage than a breakdown voltage of the Schottky junction when the Schottky junction is reverse biased.

28 Claims, 6 Drawing Sheets

U.S. PATENT DOCUMENTS

| | | |
|---|---|---|
| 2002/0125541 A1 | 9/2002 | Korec et al. |
| 2003/0025175 A1* | 2/2003 | Asano et al. ................ 257/471 |
| 2003/0178672 A1 | 9/2003 | Hatakeyama et al. |
| 2005/0275055 A1* | 12/2005 | Parthasarathy et al. ...... 257/471 |

FOREIGN PATENT DOCUMENTS

| | | |
|---|---|---|
| WO | WO97/08754 | 3/1997 |

OTHER PUBLICATIONS

Katsunori Ueno, Tatsue Urushidani, Kouichi Hahimoto, and Yasukazu Seki. "The Guard—Ring Termination for the High-Voltage SiC Schottky Barrier Diodes." *IEEE Electron Device Letters*. vol. 16. No. 7, Jul. 1995.

Singh, R. and J.W. Palmour, "Planar Terminations in 4H-SiC Schottky Diodes with Low Leakage and High Yields," *IEEE International Symposium on Power Semiconductor Devices and ICs*, 1997.

Hubel, K, "Hybrid design improves diode robustness and boosts efficiency," Compoundsemiconductor.net, 2006.

Ayalew, T, "Dissertation of Tesfaye Ayalew", Section 4.4.3.1 MPS Diode Structure, *SiC Semiconductor Devices Technology, Modeling, and Simulation*, 2006.

Extended European Search Report (12 pages) corresponding to European Application No. 07112298.0; Dated: Feb. 18,, 2009.

Losee et al., "Degraded Blocking Performance of 4H-SiC Rectifiers Under High dV/dt Conditions", Proceedings of 17$^{th}$ International Symposium on Power Semiconductor Devices & IC's, 4 pages (May 23-26, 2005). XP010820730.

Sugawara et al., "3.6 kV 4H-SiC JBS Diodes with Low RonS", Materials Science Forum, vols. 338-342:2, pp. 1183-1186 (2000). XP-000944901.

* cited by examiner

SEMICONDUCTOR DEVICES INCLUDING SCHOTTKY DIODES WITH CONTROLLED BREAKDOWN

FIELD OF THE INVENTION

The present invention relates to semiconductor devices and the fabrication of semiconductor devices and more particularly, to Junction Barrier Schottky (JBS) diodes, and the fabrication of such diodes.

BACKGROUND

High voltage silicon carbide (SiC) Schottky diodes, which may have voltage blocking ratings between, for example, about 600V and about 2.5 kV, are expected to compete with silicon PIN diodes having similar voltage ratings. Such diodes may handle as much as about 100 amps or more of forward current, depending on their active area design. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based Schottky devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n− epitaxial layer, which functions as a drift region, is formed. The device typically includes a Schottky contact formed directly on the n− layer. A junction termination region, such as a guard ring and/or p-type JTE (junction termination extension) region, is typically formed to surround the Schottky junction active region. The purpose of junction termination region is to reduce or prevent electric field crowding at the edges of the Schottky junction, and to reduce or prevent the depletion region from interacting with the surface of the device. Surface effects may cause the depletion region to spread unevenly, which may adversely affect the breakdown voltage of the device. Other termination techniques include field plates and floating field rings that may be more strongly influenced by surface effects. A channel stop region may also be formed by implantation of n-type dopants in order to prevent the depletion region from extending to the edge of the device.

Regardless of the type of termination used, the Schottky diode will fail if a large enough reverse voltage is applied to the junction. Such failures are generally catastrophic, and may damage or destroy the device. Furthermore, even before the junction has failed, a Schottky diode may experience large reverse leakage currents. In order to reduce such leakage currents, the junction barrier Schottky (JBS) diode was developed. JBS diodes are sometimes referred to as Merged PIN—Schottky (MPS) diodes. A conventional JBS diode 10 is illustrated in FIG. 1. As shown therein, a conventional JBS diode includes an n-type substrate 12 on which an n− drift layer 14 is formed. A plurality of p+ regions 16 are formed, typically by ion implantation, in the surface of the n− drift layer 14. A metal anode contact 18 is formed on the surface of the n− drift layer 14 in contact with both the n− drift layer 14 and the p+ regions 16. The anode contact 18 forms a Schottky junction with the exposed portions of the drift layer 14, and may form an ohmic contact with the p+ regions 16. A cathode contact 20 is formed on the substrate 12. Silicon carbide-based JBS diodes are described, for example, in U.S. Pat. Nos. 6,104,043 and 6,524,900.

In forward operation, the junction J1 between the anode contact 18 and the drift layer 14 turns on before the junction J2 between the p+ regions 16 and the drift layer 14. Thus, at low forward voltages, the device exhibits Schottky diode behavior. That is, current transport in the device is dominated by majority carriers (electrons) injected across the Schottky junction J1 at low forward voltages. As there may be no minority carrier injection (and thus no minority charge storage) in the device at normal operating voltages, JBS diodes have fast switching speeds characteristic of Schottky diodes.

Under reverse bias conditions, however, the depletion regions formed by the PN junctions J2 between the p+ regions 16 and the drift layer 14 expand to block reverse current through the device 10, protecting the Schottky junction J1 and limiting reverse leakage current in the device 10. Thus, in reverse bias, the JBS diode 10 behaves like a PIN diode. The voltage blocking ability of the device 10 is typically determined by the thickness and doping of the drift layer 14 and the design of the edge termination.

One problem associated with silicon carbide based Schottky diodes under forward bias operation arises due to the nature of the Schottky junction J1. Namely, the Schottky junction of a silicon carbide based device may have a relatively high resistance compared, for example to a PIN junction. In some power switching applications, current surges (e.g., transient current spikes) may be experienced from time to time. In Schottky devices, such current surges may result in the dissipation of large amounts of power at the junction, which results in heating of the junction. Heating of the Schottky junction may lower the barrier of the junction, resulting in even more current flowing through the device. This phenomenon, known as thermal runaway, may damage or destroy the device.

Thermal runaway may also occur in devices under reverse bias conditions, as reverse leakage currents may increase with temperature as a result of thermal runaway. Furthermore, other problems may arise in reverse bias conditions. For example, as noted above, if the blocking voltage of the device is exceeded, the device may break down in an uncontrolled manner, which may damage or destroy the device.

SUMMARY

A semiconductor device according to some embodiments of the invention includes a semiconductor layer having a first conductivity type and having a surface in which an active region of the semiconductor device is defined, and a plurality of spaced apart first doped regions arranged within the active region. The plurality of first doped regions have a second conductivity type that is opposite the first conductivity type, and have a first dopant concentration. The plurality of first doped regions define a plurality of exposed portions of the semiconductor layer within the active region. The semiconductor device includes a second doped region in the semiconductor layer. The second doped region has the second conductivity type and has a second dopant concentration that is greater than the first dopant concentration. The semiconductor device further includes a metal layer on the surface of the semiconductor layer. The metal layer forms a Schottky junction with the defined exposed portions of the semiconductor layer and forms an ohmic contact with the second doped region.

The metal layer may include a first metal region in contact with the exposed portions of the semiconductor layer and the first doped region, and a second metal region in contact with the second doped region. The first metal region may include a metal different from the second metal region. The first metal region may include aluminum, titanium, and/or nickel, and the second metal region may include aluminum, titanium and/or nickel.

The semiconductor layer may include a silicon carbide semiconductor layer. The first doped region may include p-type silicon carbide having a dopant concentration of from about $1\times10^{17}$ to about $1\times10^{18}$ cm$^{-3}$, and the second doped region may include p-type silicon carbide having a dopant concentration of greater than about $5\times10^{18}$ cm$^{-3}$.

The semiconductor device may further include a plurality of second doped regions in the semiconductor layer. The plurality of first doped regions may be arranged as stripes and/or islands in the semiconductor layer.

The semiconductor layer may include an epitaxial layer of silicon carbide. The semiconductor device may further include a silicon carbide substrate having the first conductivity type, and the semiconductor layer may be on the substrate. The semiconductor device may further include an ohmic contact on the substrate.

The first conductivity type may be n-type and the second conductivity type may be p-type. In some embodiments, the first conductivity type may be p-type and the second conductivity type may be n-type.

The first doped region and the second doped region may be located at the surface of the semiconductor layer. A ratio of the surface area occupied by the first doped region and the second doped region to the total surface area of the active region of the diode may be about 0.3.

A turn-on voltage of a p-n junction between the second doped region and the semiconductor layer may be higher than a turn-on voltage of the Schottky junction between the metal layer and the exposed portions of the semiconductor layer.

The first doped region may have a dopant concentration and a thickness such that punch-through of a junction between the first doped region and the semiconductor layer occurs at a lower voltage than avalanche breakdown of the Schottky junction between the metal layer and the exposed portions of the semiconductor layer.

The semiconductor device may further include an edge termination region, and the first doped region may have a dopant concentration and thickness such that punch-through of a junction between the first doped region and the semiconductor layer occurs at a lower voltage than a breakdown voltage of the edge termination.

A semiconductor device according to further embodiments of the invention includes a semiconductor layer having a first conductivity type, a metal contact on the semiconductor layer and forming a Schottky junction with the semiconductor layer, and a semiconductor region in the semiconductor layer. The semiconductor region and the semiconductor layer form a first p-n junction in parallel with the Schottky junction. The first p-n junction is configured to generate a depletion region in the semiconductor layer adjacent the Schottky junction when the Schottky junction is reversed biased to limit reverse leakage current through the Schottky junction. The first p-n junction may be further configured such that punch-through of the first p-n junction occurs at a lower voltage than a breakdown voltage of the Schottky junction when the Schottky junction is reverse biased.

The semiconductor device may further include a second semiconductor region forming a second p-n junction in parallel with the Schottky junction and the first p-n junction. The second p-n junction may be configured to turn on at a higher forward voltage than the Schottky junction.

The first semiconductor region may have a first dopant concentration, and the second semiconductor region may have a second dopant concentration higher than the dopant concentration of the first semiconductor region.

The semiconductor layer may include a silicon carbide semiconductor layer. The first semiconductor region may include p-type silicon carbide having a dopant concentration of from about $1\times10^{17}$ to about $1\times10^{18}$ cm$^{-3}$, and the second semiconductor region may include p-type silicon carbide having a dopant concentration of greater than about $5\times10^{18}$ cm$^{-3}$.

The first semiconductor region may include a plurality of first doped regions in the semiconductor layer, and the second semiconductor region may include a plurality of second doped regions in the semiconductor layer. The plurality of first doped regions may be arranged as stripes and/or islands in the semiconductor layer.

Methods of forming a semiconductor device according to some embodiments of the invention include forming a first doped region in a semiconductor layer, and forming a metal layer on the semiconductor layer, The semiconductor layer has a first conductivity type and the first doped region has a second conductivity type opposite the first conductivity type, such that the semiconductor layer and the first doped region form a p-n junction. The metal layer forms a Schottky junction with the semiconductor layer and contacts the first doped region. The first doped region may have a thickness and dopant concentration such that punch-through of the p-n junction occurs at a lower voltage than an avalanche breakdown voltage of the Schottky junction between the metal layer and the semiconductor layer when the Schottky junction is reversed biased.

The methods may further include forming a second doped region in the semiconductor layer, the second doped region having a conductivity type opposite the conductivity type of the semiconductor layer and having a dopant concentration higher than the dopant concentration of the first doped region.

A junction between the second doped region and the semiconductor layer may be configured to turn on at a voltage that is higher than a turn-on voltage of the Schottky junction between the metal layer and the semiconductor layer.

Forming the metal layer may include forming a first metal layer on the second doped region. The first metal layer forms an ohmic contact with the second doped region. Forming the metal layer may further include forming a second metal layer on the semiconductor layer and the first doped region, the second metal layer forming the Schottky junction with the semiconductor layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
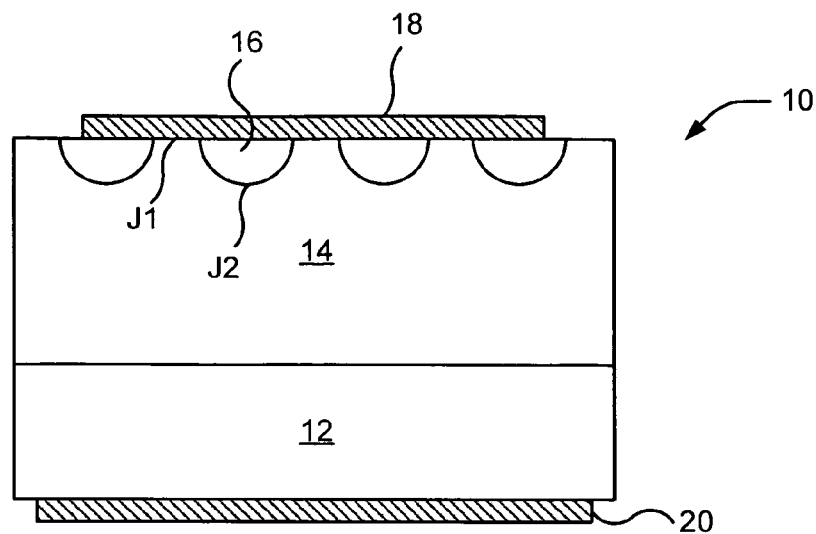
FIG. 1 is a cross-sectional view of a conventional JBS diode.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Figure 2:
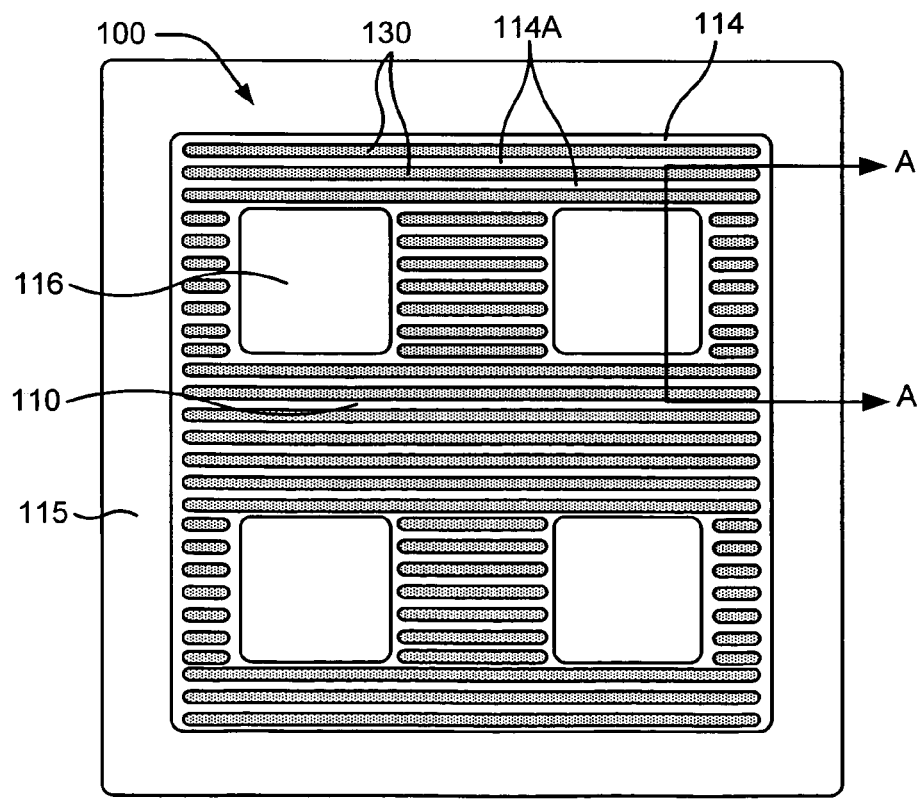
FIG. 2 is a top view of a JBS diode according to some embodiments of the present invention.

FIG. 2 is a top view of a diode 100 according to some embodiments of the invention. The diode 100 includes a drift layer 114 having an upper surface in which a plurality of lightly doped regions 130 of opposite conductivity type from the drift layer 114 are formed. In the embodiments of FIG. 2, the lightly doped regions 130 are formed as stripe-shaped regions in the drift layer 114. The lightly doped regions 130 may be formed in other shapes, however.

The drift layer 114 may be formed, for example, from n-type silicon carbide of the 2H, 4H, 6H, 3C and/or 15R polytype having a dopant concentration of about $2 \times 10^{14}$ to about $1 \times 10^{17}$ cm$^{-3}$, depending on design requirements for voltage blocking and on-resistance for the diode 100. Other types of semiconductor materials, such as GaN, GaAs, silicon or germanium may be used. In particular embodiments, the drift layer 114 includes 4H—SiC doped with n-type dopants at a concentration of about $5 \times 10^{15}$ cm$^{-3}$. The lightly doped regions 130 may be formed, for example, by ion implantation of p-type dopants such as boron and/or aluminum into the drift layer 114 at a concentration of about $1 \times 10^{17}$ to about $1 \times 10^{18}$ cm$^{-3}$, and may extend to a depth of about 0.3 to about 0.5 μm beneath the surface of the drift layer 114. In particular embodiments, the lightly doped regions 130 may be doped at a dopant concentration of about $5×10^{17}$ cm$^{-3}$, and may extend to a depth of about 0.3 μm beneath the surface of the drift layer 114.

A plurality of heavily doped regions 116 are also provided in the drift layer 114. The heavily doped regions 116 may be formed, for example, by ion implantation of p-type dopants such as boron and/or aluminum into the drift layer 114 at a concentration of about $1×10^{18}$ to about $1×10^{19}$ cm$^{-3}$, and may extend to a depth of about 0.3 to about 0.5 μm beneath the surface of the drift layer 114. In particular embodiments, the heavily doped regions 116 may be doped at a dopant concentration of about $5×10^{18}$ cm$^{-3}$, and may extend to a depth of about 0.3 μm beneath the surface of the drift layer 114. Regions 116 may be formed, for example, by epitaxial growth.

The lightly doped regions 130 shown in the embodiments of FIG. 2 are provided as spaced apart striped regions that expose portions 114A of the surface of the drift layer 114 and that extend across an active region 110 of the drift layer 114 (except for the exposed portions 114A of the drift layer and the heavily doped regions 116). A metal Schottky contact (not shown) covers the drift layer 114 and is in contact with the exposed portions 114A of the drift layer 114 as well as the lightly doped regions 130 and the heavily doped regions 116. As used herein, the term "active region" refers to the two dimensional area of the device in which the Schottky metal contacts the drift layer and includes the exposed portions 114A of the drift layer 114, the lightly doped regions 130 and the heavily doped regions 116. Accordingly, the active region includes the Schottky junction area but does not include, for example, the edge termination region described below.

The diode 100 may include an edge termination region 115 surrounding the active region 110 of the diode 100. The edge termination region 115 may include a junction termination extension (JTE) region, field rings, field plates, guard rings, and/or a combination of the foregoing or other terminations.

Additional conventional terminations of SiC Schottky diodes are described in "Planar Terminations in 4H—SiC Schottky Diodes With Low Leakage And High Yields" by Singh et al., ISPSD '97, pp. 157 160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331 332. Additionally, other termination techniques are described in published PCT Application No. WO 97/08754 entitled "SiC Semiconductor Device Comprising A PN Junction With A Voltage Absorbing Edge."

Another type of junction termination is disclosed in U.S. Pat. No. 7,026,650, which is assigned to the assignee of the present invention, the disclosure of which is incorporated herein by reference as if set forth fully.

Figure 3:
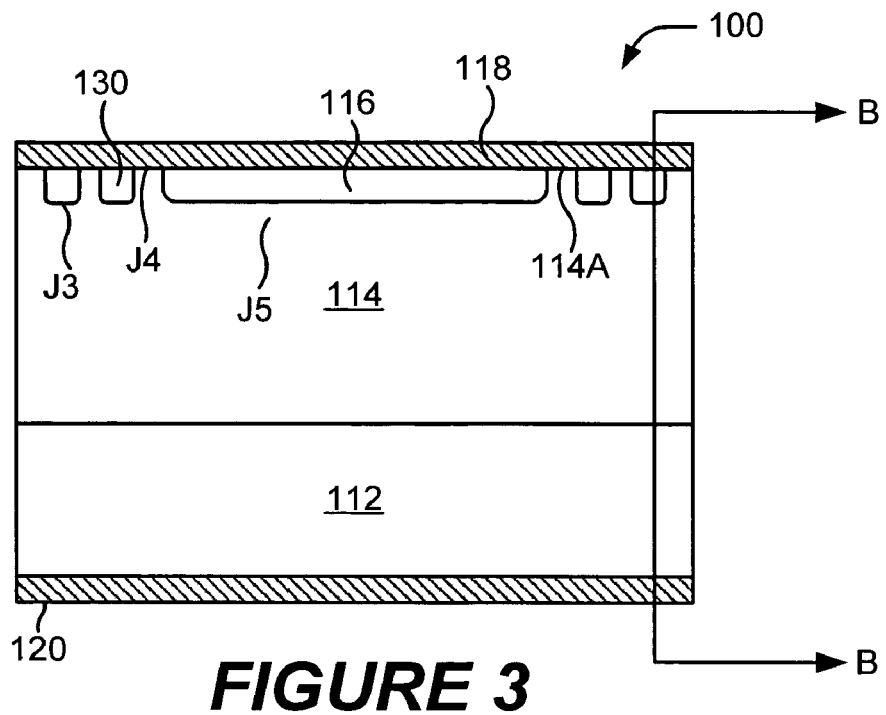
FIG. 3 is a cross-sectional view of a JBS diode according to some embodiments of the present invention.

FIG. 3 is a cross section illustration of the diode 100 taken generally along lines A-A of FIG. 2. The dimensions of some features of the diode 100 are exaggerated for clarity. As seen in FIG. 3, the diode 100 includes a substrate 112 on which the drift layer 114 is formed. The heavily doped regions 116 may be formed as an implanted region within the drift layer 114. Similarly, the lightly doped regions 130 may be formed as implanted regions in the drift layer 114. As the heavily doped regions 116 and the lightly doped regions 130 have an opposite conductivity type from the drift layer 114, the lightly doped regions 130 form a p-n junction J3 with the drift layer 114, while the heavily doped regions 116 form a p-n junction J5 with the drift layer 114.

The ratio of the surface area of the active region 110 of the device 100 occupied by the lightly doped regions 130 and the heavily doped regions 116 to the total surface area of the active region 110 may affect both the reverse leakage current of the device 100 and the forward voltage drop of the device 100. For example, if the area occupied by the lightly doped regions 130 and the heavily doped regions 116 is increased relative to the total area of the active region 110, the reverse leakage current may be reduced, but the forward voltage drop of the device 100 may increase. Thus, the selection of the ratio of the surface area of the active region 110 of the device 100 occupied by the lightly doped regions 130 and the heavily doped regions 116 to the total surface area of the active region 110 may entail a trade-off between reverse leakage current and forward voltage drop. In some embodiments, the ratio of the surface area of the active region 110 of the device 100 occupied by the lightly doped regions 130 and the heavily doped regions 116 to the total surface area of the active region 110 may be between about 2% and 40%.

An anode contact 118 on the surface of the drift layer 114 forms a Schottky junction J4 with the exposed portions 114A of the drift layer 114 between adjacent lightly doped regions 130 and/or between a lightly doped region 130 and the heavily doped region 116. The anode contact 118 may include a metal, such as aluminum, titanium and/or nickel, that may form an ohmic contact with the heavily doped region 116, while forming a Schottky contact with the drift layer 114.

A cathode contact 120 is formed on a side of the substrate 112 opposite the drift layer 114. The cathode contact 120 may include a metal, such as nickel, that is capable of forming an ohmic contact to n-type silicon carbide.

In forward operation, the junction J4 between the anode contact 118 and the exposed portions 114A of the drift layer 114 turns on before the junction J5 between the heavily doped region 116 and the drift layer 114. Thus, at low forward voltages, the device exhibits Schottky diode behavior. That is, at low forward voltages, the operation of the diode 100 is dominated by the injection of majority carriers across the Schottky junction J4. Due to the absence of minority carrier injection under normal operating conditions, the diode 100 may have a very fast switching capability, which is characteristic of Schottky diodes in general.

The heavily doped region 116 may be designed to begin to conduct at a forward voltage that is higher than the turn-on voltage of the Schottky junction J4. Thus, in the event of a current surge that causes the forward voltage of the diode 100 to increase, the p-n junction J5 will begin to conduct. Once the p-n junction J5 begins to conduct, the operation of the diode 100 is dominated by the injection and recombination of minority carriers across the p-n junction J5. In that case, the on-resistance of the diode may decrease, which may decrease the amount of power dissipated by the diode 100 for a given level of current. Thus, turn-on of the p-n junction J5 when the forward voltage of the diode 100 increases may reduce and/or prevent forward current runaway in the diode 100.

Under reverse bias conditions, however, the depletion regions formed by the p-n junctions J3 between the lightly doped regions 130 and the drift layer 114, as well as the depletion region of the p-n junction J5, may expand to block reverse current through the device 100, protecting the Schottky junction J4 and limiting reverse leakage current in the device 100. Thus, in reverse bias, the diode 100 may function substantially like a PIN diode.

Unlike a conventional JBS Schottky diode, the voltage blocking ability of a diode 100 according to some embodiments of the invention is determined by the thickness and doping of the lightly doped regions 130. That is, when a sufficiently large reverse voltage is applied to the diode 100, the depletion regions in the lightly doped regions 130 will punch through to the depletion region associated with the anode contact 118, permitting a large reverse current to flow through the device 100. As the lightly doped regions 130 are distributed across the active region of the diode 100, this reverse breakdown may be uniformly distributed and controlled such that it may not damage the diode 100. That is, the breakdown of the device 100 may be localized to a punch-through of the lightly doped regions 130, which may result in a breakdown current that is distributed evenly across the active region 110 of the diode 100. As a result, the breakdown characteristics of the diode 100 may be controlled, and the diode 100 may be capable of sustaining large reverse currents without damaging and/or destroying the diode 100.

In some embodiments, the doping of the lightly doped regions 130 may be chosen such that the punch-through voltage is slightly less than the maximum reverse voltage that may otherwise be supported by the edge termination of the diode 100.

Figure 4A:
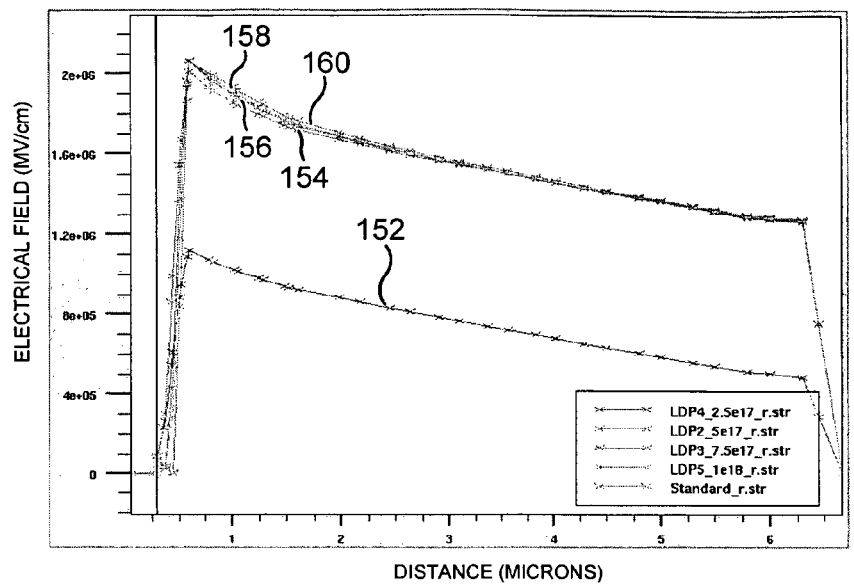
FIGS. 4A and 4B are graphs of electric field versus depth in a JBS diode according to some embodiments of the invention.

FIG. 4A is a graph of simulated vertical electric field distributions in devices according to some embodiments of the invention, for example, along line B-B of FIG. 3, for devices having varying levels of doping in the lightly doped regions 130, as well as for a conventional JBS Schottky diode device having no lightly doped regions 130. For the conventional JBS Schottky diode, the vertical field distribution through one of the p+ regions 16 and the drift layer 14 (FIG. 1) is shown. In particular, FIG. 4A illustrates vertical fields at breakdown voltages for four devices including lightly doped regions 130 having dopant concentrations of $2.5 \times 10^{17}$ cm$^{-3}$ (Curve 152), $5 \times 10^{17}$ cm$^{-3}$ (Curve 154), $7.5 \times 10^{17}$ cm$^{-3}$ (Curve 156) and $1 \times 10^{18}$ cm$^{-3}$ (Curve 158) as well as for one conventional JBS Schottky diode (Curve 160).

For the device having a dopant concentration of $2.5 \times 10^{17}$ cm$^{-3}$ in the lightly doped regions 130, the depletion region in the lightly doped region 130 has punched through to the Schottky contact 118, resulting in a lowering of the field in the device, as shown by curve 152. For the device with a dopant concentration of $1 \times 10^{18}$ cm$^{-3}$ in the lightly doped regions 130, the device behaves more like a conventional JBS Schottky diode, in that the depletion region does not extend far into the lightly doped regions 130. In the remaining devices, the depletion region in the lightly doped regions 130 begins to approach the depletion region beneath the Schottky contact 118. When the depletion region of the lightly doped region 130 contacts the depletion region associated with the Schottky contact 118, punch through begins to occur, which permits reverse current flow from the drift layer 114 to the Schottky contact 118 to increase rapidly with reverse voltage.

Figure 4B:
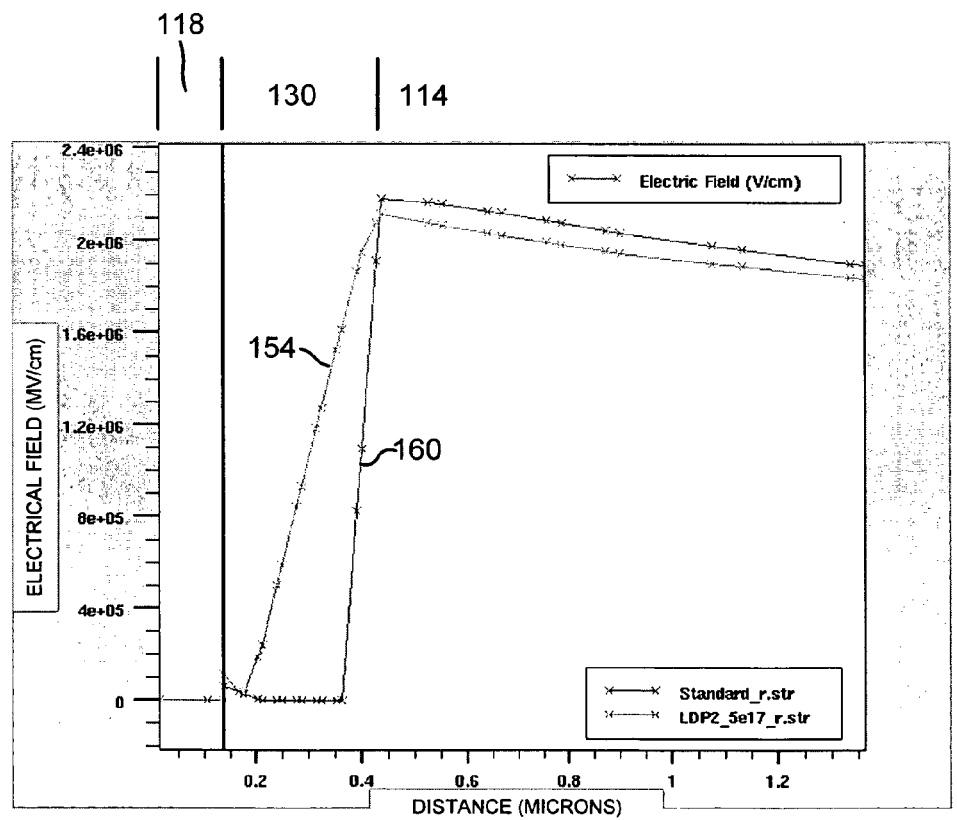

The shape of the depletion region in the lightly doped regions 130 is illustrated in greater detail in FIG. 4B, which is a rescaled graph of curves 154 and 160 of FIG. 4A. As seen in FIG. 4B, for the device having a dopant concentration in the lightly doped regions 130 of $5 \times 10^{17}$ cm$^{-3}$, the depletion region in the lightly doped region 130 associated with the p-n junction between the lightly doped region 130 and the drift layer 114 extends into the lightly doped region 130 to the point that it contacts the depletion region formed by the Schottky contact 118.

Figure 5A:
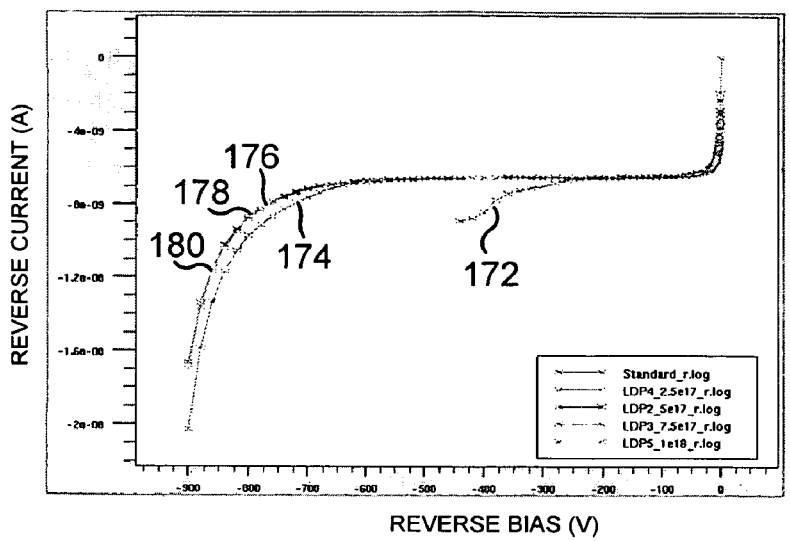
FIGS. 5A and 5B are graphs of reverse current versus reverse bias for JBS diodes according to some embodiments of the invention.

FIG. 5A is a graph of simulated reverse current versus reverse bias for 600V-rated JBS Schottky devices having varying levels of doping in the lightly doped regions 130, as well as for a device with no lightly doped regions. In particular, FIG. 5A illustrates reverse currents for four devices including lightly doped regions 130 having dopant concentrations in the lightly doped regions 130 of $2.5 \times 10^{17}$ cm$^{-3}$ (Curve 172), $5 \times 10^{17}$ cm$^{-3}$ (Curve 174), $7.5 \times 10^{17}$ cm$^{-3}$ (Curve 176) and $1 \times 10^{18}$ cm$^{-3}$ (Curve 178) as well as for one conventional JBS Schottky diode (Curve 180). The device having a dopant concentration of $2.5 \times 10^{17}$ cm$^{-3}$ in the lightly doped regions 130 (Curve 172) exhibits premature breakdown, while curves 178 and 180 are practically coincident, indicating that the device having a dopant concentration of $1 \times 10^{18}$ cm$^{-3}$ may not break down due to punch-through of the lightly doped regions 130.

Figure 5B:
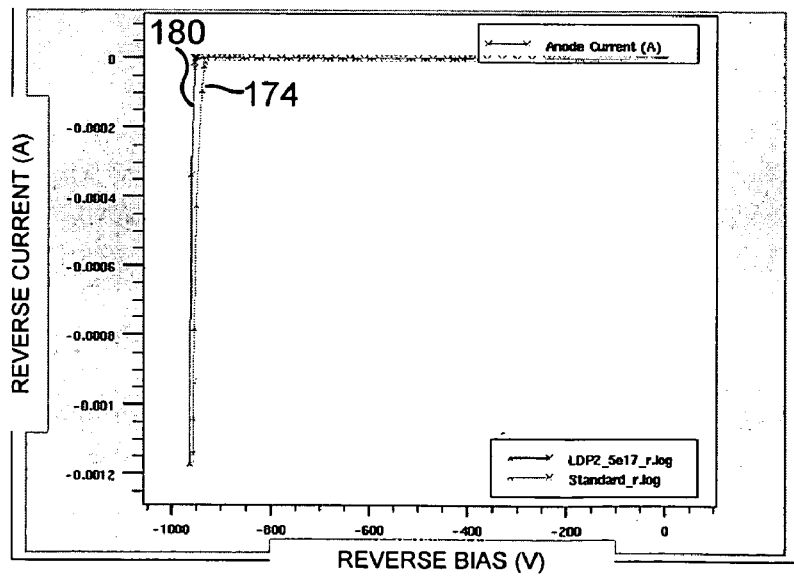

FIG. 5B is a rescaled graph of curves 174 and 180. As seen in FIG. 5B, a Schottky diode including lightly doped regions 130 having a doping concentration of $5 \times 10^{17}$ cm$^3$ can exhibit similar breakdown behavior as a standards JBS Schottky diode, albeit with more uniform reverse current leakage distribution.

Figure 6:
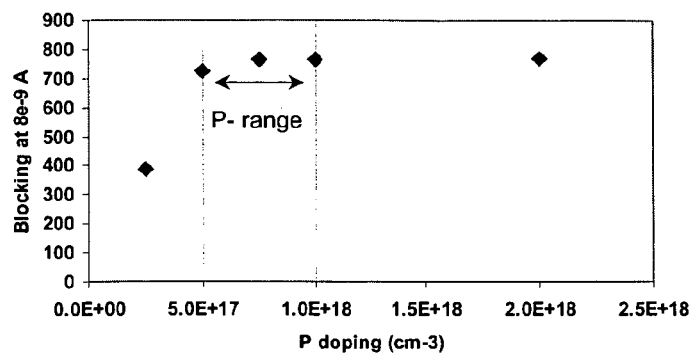
FIG. 6 is a graph of blocking voltage versus doping for JBS diodes according to some embodiments of the invention.

FIG. 6 is a plot of blocking voltage versus doping for JBS diodes according to some embodiments of the invention. As shown in FIG. 6, a dopant concentration for the lightly doped regions 130 as low as $5 \times 10^{17}$ cm$^{-3}$ may result in a diode having a desired blocking voltage. As the dopant concentration is increased beyond about $7.5 \times 10^{17}$ cm$^{-3}$, however, the blocking voltage does not increase substantially. However, as noted above, the breakdown mechanism may not be punch-through for devices with higher dopant concentrations in the lightly doped regions 130.

It will be appreciated by those skilled in the art that the doping concentrations and dimensions required to obtain a desired punch-thorough voltage in a device fabricated in accordance with the present invention may vary from the concentrations and/or dimensions described above due, for example, to differences in manufacturing techniques.

Figure 7:
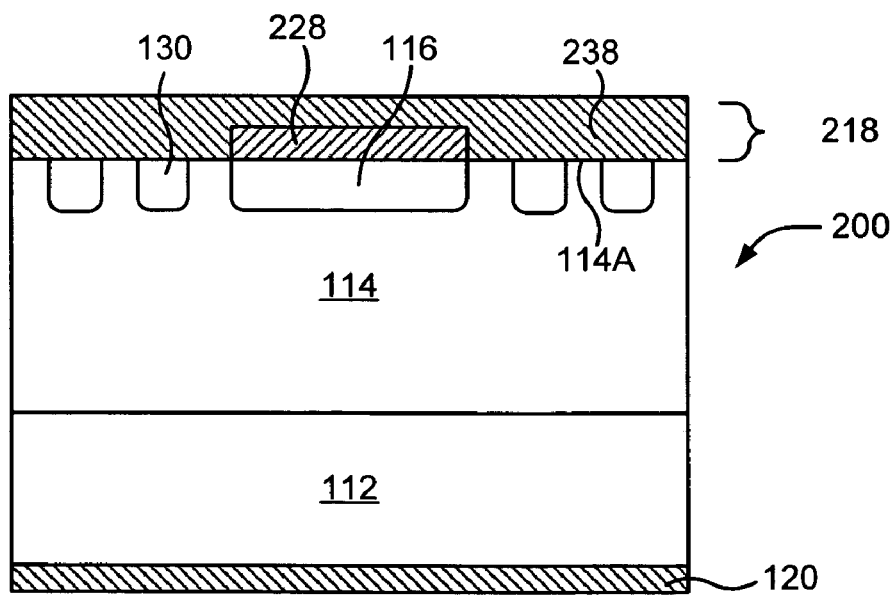
FIG. 7 is a cross-sectional view of a JBS diode according to further embodiments of the present invention.

A diode 200 according to further embodiments of the invention is illustrated in FIG. 7. The diode 200 includes a substrate 112 and a drift layer 114. A heavily doped region 116 is formed in the drift layer 114 along with a plurality of lightly doped regions 130. The diode 200 further includes an anode contact 218 that includes a first portion 228 that forms an ohmic contact on the heavily doped region 116 and a second portion 238 that forms a Schottky contact with the drift layer 114. As shown in FIG. 7, the second portion 238 may be formed to cover the first portion 228 of the anode contact 218. The first portion 228 may include, for example, aluminum, titanium and/or nickel, while the second portion 238 may include, for example, aluminum, titanium and/or nickel. Other suitable materials for forming ohmic and/or Schottky contacts to silicon carbide are known in the art and may be used in connection with some embodiments of the invention.

Figure 8:
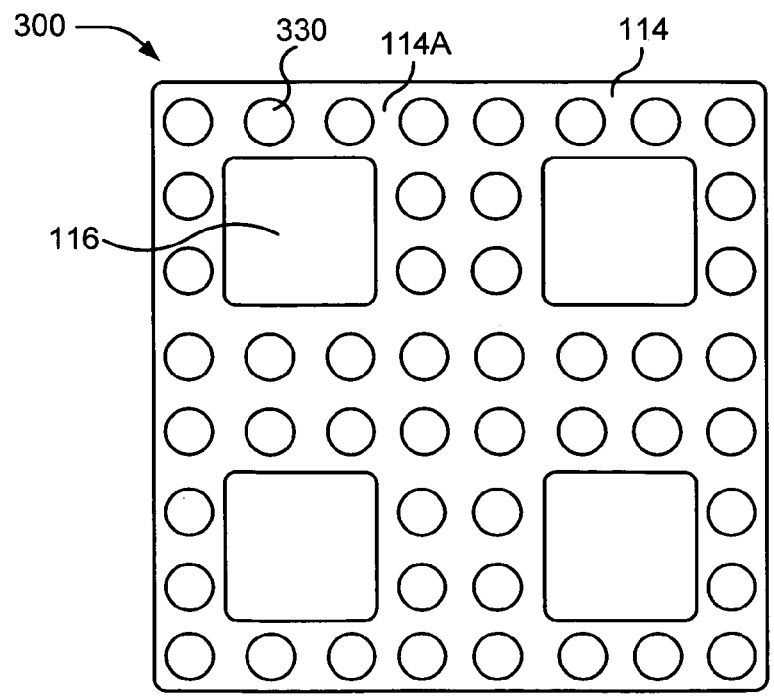
FIG. 8 is a top view of a JBS diode according to further embodiments of the present invention.

FIG. 8 illustrates a diode 300 according to further embodiments of the invention. As shown in FIG. 8, the diode 300 may include a plurality of lightly doped regions 330 that are arranged as circular islands 330 in the drift layer 114, as opposed to the stripe-shaped regions of the device 100 of FIG. 2. In some embodiments, the lightly doped regions 330 may have a shape that is generally rectangular and/or that is irregular.

Figure 9:
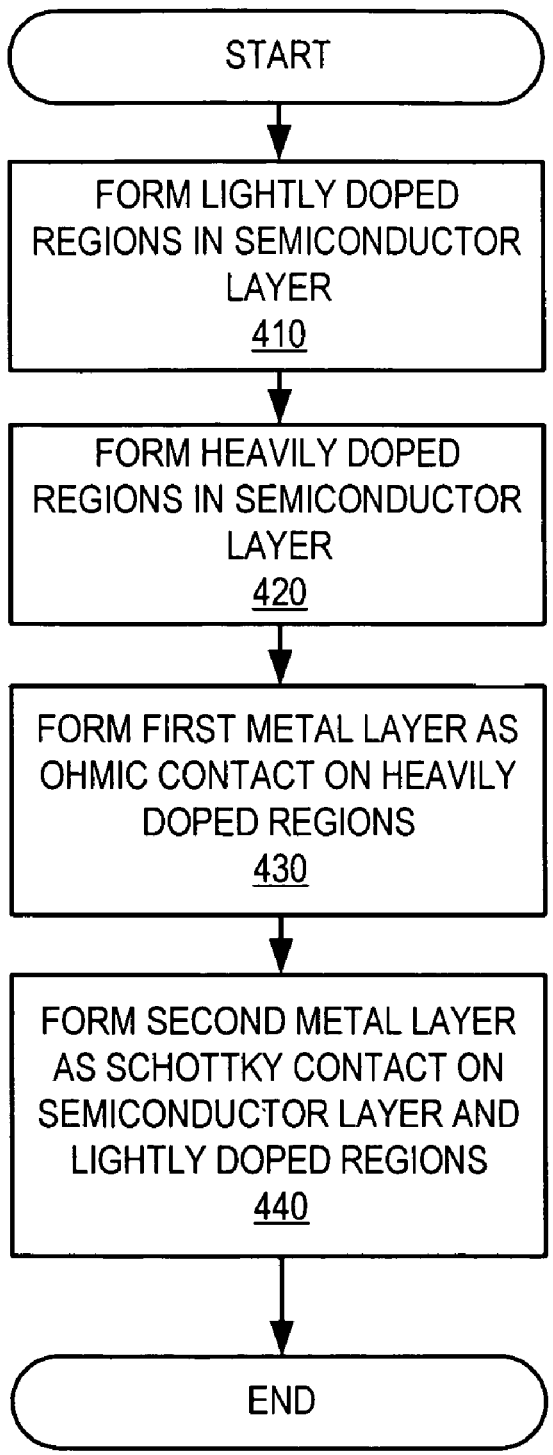
FIG. 9 is a flowchart illustrating operations according to some embodiments of the invention.

Methods according to some embodiments of the invention are illustrated in the flowchart of FIG. 9. As shown therein, the methods include forming lightly doped regions 130 in a semiconductor layer 114 (block 410). As noted above, the lightly doped regions 130 have a conductivity type opposite the conductivity type of the semiconductor layer 114.

The methods further include forming heavily doped regions 116 in the semiconductor layer 114 (block 420). The heavily doped regions 116 have the same conductivity type as the lightly doped regions 130, but are more heavily doped than the lightly doped regions 130. The lightly doped regions 130 and the heavily doped regions may be formed via ion implantation.

A first metal layer 228 is formed as an ohmic contact on the heavily doped regions 116 (block 430), and a second metal layer 238 is formed on the semiconductor layer 114 and the lightly doped regions 130 (block 440). The second metal layer 238 may form a Schottky contact with the exposed portions 114A of the semiconductor layer 114. The second metal layer 238 may also form a Schottky contact with the lightly doped regions 130.

While embodiments of the present invention have been described with reference to particular sequences of operations, as will be appreciated by those of skill in the art, certain operations within the sequence may be reordered while still benefiting from the teachings of the present invention. Accordingly, the present invention should not be construed as limited to the exact sequence of operations described herein.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device, comprising:
   a semiconductor layer having a first conductivity type and having a surface in which an active region of the semiconductor device is defined;
   a plurality of spaced apart first doped regions arranged within the active region, the plurality of first doped regions having a second conductivity type that is opposite the first conductivity type, having a first dopant concentration, and defining a plurality of exposed portions of the semiconductor layer within the active region;
   a second doped region in the active region of the semiconductor layer, the second doped region having the second conductivity type and having a second dopant concentration that is greater than the first dopant concentration;
   a metal layer on the surface of the semiconductor layer, the metal layer forming a Schottky junction with the defined exposed portions of the semiconductor layer and forming an ohmic contact with the second doped region.

2. The semiconductor device of claim 1, wherein the metal layer comprises a first metal region in contact with the exposed portions of the semiconductor layer and the first doped region and a second metal region in contact with the second doped region and in direct contact with the first metal region, wherein the first metal region comprises a metal different from the second metal region.

3. The semiconductor device of claim 2, wherein the first metal region comprises aluminum, titanium and/or nickel, and the second metal region comprises aluminum, titanium and/or nickel.

4. The semiconductor device of claim 2, wherein the semiconductor layer comprises a silicon carbide semiconductor layer.

5. The semiconductor device of claim 4, wherein the first doped region comprises p-type silicon carbide having a dopant concentration of from about $1\times10^{17}$ to about $1\times10^{18}$ cm$^{-3}$, and the second doped region comprises p-type silicon carbide having a dopant concentration of greater than about $5\times10^{18}$ cm$^{-3}$.

6. The semiconductor device of claim 1, wherein the second doped region comprises a plurality of second doped regions in the semiconductor layer, wherein the plurality of first doped regions are arranged as stripes in the semiconductor layer.

7. The semiconductor device of claim 1, wherein the second doped region comprises a plurality of second doped regions in the semiconductor layer, wherein the plurality of first doped regions are arranged as islands in the semiconductor layer.

8. The semiconductor device of claim 1, wherein the semiconductor layer comprises an epitaxial layer of silicon carbide.

9. The semiconductor device of claim 8, further comprising a silicon carbide substrate having the first conductivity type, wherein the semiconductor layer is on the substrate.

10. The semiconductor device of claim 9, wherein the ohmic contact comprises a first ohmic contact, the semiconductor device further comprising a second ohmic contact on the substrate.

11. The semiconductor device of claim 1, wherein the first conductivity type is n-type and the second conductivity type is p-type.

12. The semiconductor device of claim 1, wherein the first conductivity type is p-type and the second conductivity type is n-type.

13. The semiconductor device of claim 1, wherein the plurality of first doped regions and the second doped region are located at the surface of the semiconductor layer, and wherein a ratio of a surface area occupied by the plurality of first doped regions and the second doped region to a total surface area of the active region of the diode is about 0.3.

14. The semiconductor device of claim 1, wherein a turn-on voltage of a p-n junction between the second doped region and the semiconductor layer is higher than a turn-on voltage of the Schottky junction between the metal layer and the exposed portions of the semiconductor layer.

15. The semiconductor device of claim 1, wherein the first doped region has a thickness and dopant concentration such that punch-through of a p-n junction between the first doped region and the semiconductor layer occurs at a lower voltage than breakdown of the Schottky junction between the metal layer and the exposed portions of the semiconductor layer.

16. The semiconductor device of claim 1, further comprising an edge termination region, wherein the first doped region has a thickness and dopant concentration such that punch-through of a p-n junction between the first doped region and the semiconductor layer occurs at a lower voltage than a breakdown voltage of the edge termination region.

17. The semiconductor device of claim 1, further comprising at least two second doped regions in the semiconductor layer, wherein the plurality of spaced apart first doped regions are between the at least two second doped regions.

18. The semiconductor device of claim 17, further comprising an edge termination region that defines an active region of the semiconductor device inside the edge termination region, wherein the plurality of spaced apart first doped regions are within the active region defined by the edge termination region.

19. A semiconductor device comprising:
    a semiconductor layer having a first conductivity type;
    a metal contact on the semiconductor layer and forming a Schottky junction with the semiconductor layer;
    a semiconductor region in the semiconductor layer, the semiconductor region and the semiconductor layer forming a p-n junction in parallel with the Schottky junction and configured to generate a depletion region in the semiconductor layer adjacent the Schottky junction when the Schottky junction is reversed biased to limit reverse leakage current through the Schottky junction, wherein the p-n junction is further configured such that punch-through of the p-n junction occurs at a lower voltage than a breakdown voltage of the Schottky junction.

20. The semiconductor device of claim 19, wherein the p-n junction comprises a first p-n junction, the semiconductor device further comprising a second semiconductor region forming a second p-n junction in parallel with the Schottky junction and the first p-n junction, wherein the second p-n junction is configured to turn on at a higher forward voltage than the Schottky junction.

21. The semiconductor device of claim 20, wherein the semiconductor region comprises a first semiconductor region and a second semiconductor region, and wherein the first semiconductor region has a first dopant concentration and the second semiconductor region has a second dopant concentration higher than the dopant concentration of the first semiconductor region.

22. The semiconductor device of claim 21, wherein the semiconductor layer comprises a silicon carbide semiconductor layer.

23. The semiconductor device of claim 22, wherein the first semiconductor region comprises p-type silicon carbide having a dopant concentration of from about $1 \times 10^{17}$ to about $1 \times 10^{18}$ cm$^{-3}$, and the second semiconductor region comprises p-type silicon carbide having a dopant concentration of greater than about $5 \times 10^{18}$ cm$^{-3}$.

24. The semiconductor device of claim 20, wherein the first semiconductor region comprises a plurality of first doped regions in the semiconductor layer and the second semiconductor region comprises a plurality of second doped regions in the semiconductor layer.

25. The semiconductor device of claim 24, wherein the plurality of first doped regions are arranged as stripes in the semiconductor layer.

26. The semiconductor device of claim 24, wherein the plurality of first doped regions are arranged as islands in the semiconductor layer.

27. The semiconductor device of claim 19, further comprising a plurality of semiconductor regions in the semiconductor layer that form p-n junctions in parallel with the Schottky junction and that are configured to generate a depletion region in the semiconductor layer adjacent the Schottky junction when the Schottky junction is reversed biased to limit reverse leakage current through the Schottky junction, wherein the p-n junctions are further configured such that punch-through of the p-n junctions occurs at a lower voltage than a breakdown voltage of the Schottky junction.

28. The semiconductor device of claim 27, further comprising an edge termination region that defines an active region of the semiconductor device inside the edge termination region, wherein the plurality of semiconductor regions are within the active region defined by the edge termination region.

* * * * *